(12) United States Patent
Nelson et al.

(10) Patent No.: US 6,702,595 B2
(45) Date of Patent: Mar. 9, 2004

(54) FUSE CLIP FOR CIRCUIT BOARDS

(75) Inventors: Arnold Ray Nelson, Redlands, CA (US); Derek A. Harris, Grand Terrace, CA (US)

(73) Assignee: The Turo Company, Bloomington, MN (US)

( * ) Notice: Subject to any disclaimer, the term of this patent is extended or adjusted under 35 U.S.C. 154(b) by 0 days.

(21) Appl. No.: 10/165,945

(22) Filed: Jun. 10, 2002

(65) Prior Publication Data

US 2003/0228808 A1 Dec. 11, 2003

(51) Int. Cl.[7] ................................................ H01R 12/00
(52) U.S. Cl. .......................................... 439/83; 439/850
(58) Field of Search ................................. 439/850, 876, 439/83, 82, 567, 896; 361/809

(56) References Cited

U.S. PATENT DOCUMENTS 5,181,866 A * 1/1993 Jerome et al. ............... 439/850
5,624,269 A * 4/1997 Kanamori et al. ............ 439/83
6,132,225 A * 10/2000 Murr et al. ................... 439/82

* cited by examiner

*Primary Examiner*—Alexander Gilman
(74) *Attorney, Agent, or Firm*—Stout, Uxa, Buyan & Mullins, LLP

(57) ABSTRACT

A stable fuse clip for printed circuit boards has a vertical back plate, a pair of forwardly extending vertical flanges, and a rearwardly extending horizontal flange strengthened against bending. The horizontal flange, the bottom edges of the vertical flanges, and the bottom edge of the back plate are horizontally coplanar and rest on the surface of the circuit board. Two legs extend downwardly through the board from the lateral sides of the back plate, and one leg extends downwardly from the distal end of the horizontal flange.

7 Claims, 2 Drawing Sheets

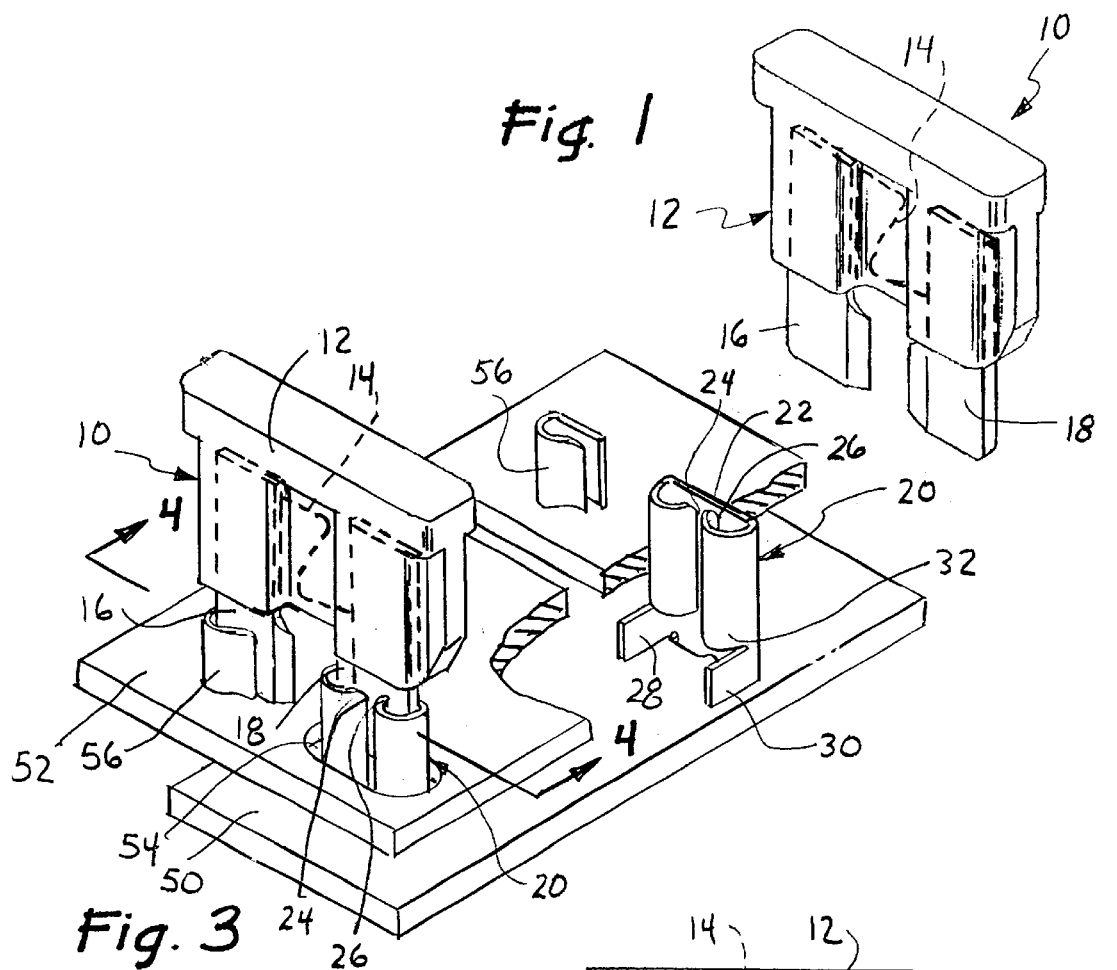
Fig. 1
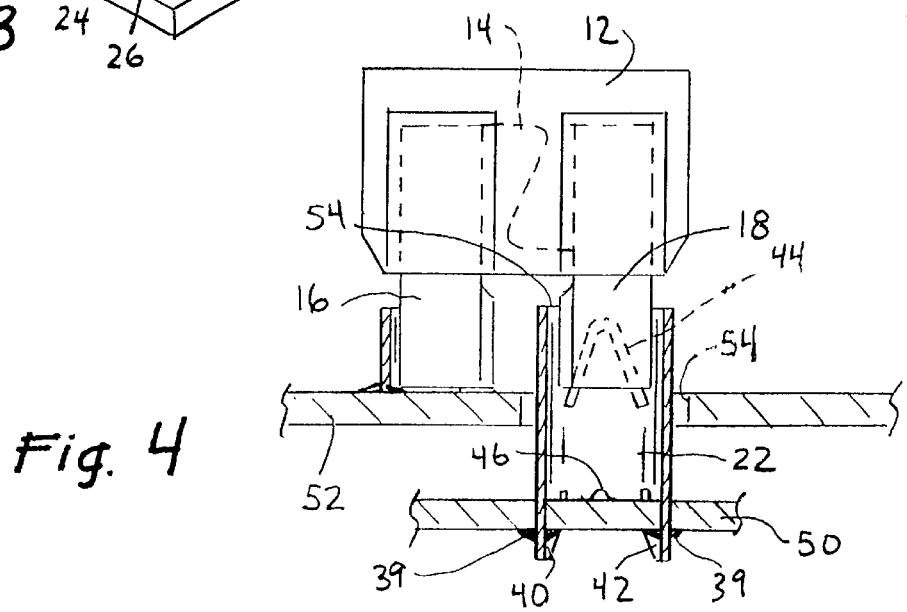
Fig. 3
Fig. 4

FUSE CLIP FOR CIRCUIT BOARDS

FIELD OF THE INVENTION

This invention relates to fuse clips that are soldered to a circuit board to removably receive a flat contact tab of a common automotive fuse, and more particularly to a clip for multi-level circuit boards which is resistant to misalignment and breakage during both the manufacture of the circuit board and the replacement of fuses in the field.

BACKGROUND OF THE INVENTION

Various types of complex electronic equipment, as for example sprinkler controllers for golf courses, are commonly installed in locations far from electronics supply centers where odd-sized or odd-shaped fuses are likely to be available. Such equipment, particularly in lightning-prone locations, is nevertheless preferably equipped with many fuses so that a lightning strike or short-circuit will disable only a small section of the controlled system rather than shut the controller down entirely. To facilitate the maintenance or repair of such equipment in remote locations, it is desirable that the fuses used in the equipment be common flat automotive fuses which are readily available at any automotive service station.

In order to receive such automotive fuses, printed circuit boards have in the past been equipped with resilient clips into which the flat contact tabs of the fuses can be removably inserted. Examples of such clips and other circuit board contacts are found in U.S. Pat. No. 4,668,866 to Legrady, U.S. Pat. No. 5,624,269 to Kanamori and U.S. Pat. No. 2,869,107 to Engel. Although the contacts of those patents are generally satisfactory for light use, problems arise when they are used in environments using wave-soldered multi-level circuit board assemblies in which fuses interconnect circuits on different levels. Such assemblies require relatively long clips so that a clip mounted on a lower level can protrude high enough above an upper level to securely receive a fuse tab. The extra length of the clip, however, makes it susceptible to tilting when it is inserted into the circuit board prior to soldering. Also, the extra length magnifies the bending stress to which the clip is subjected when a spent fuse is pulled out of the clip, particularly when relatively frequent replacement of the fuses can be expected. In those environments, misalignment of the clip during manufacture, and breakage of the solder connection when the fuse is replaced, can readily occur with adverse results such as intermittent malfunctions.

SUMMARY OF THE INVENTION

The fuse clip of this invention substantially reduces clip alignment problems during manufacturing, and solder connection breakage during fuse replacement, by providing a clip which is stabilized by surfaces extending substantially from each face of the clip parallel to the circuit board, so as to maintain the clip vertical prior to soldering and to prevent the clip from tilting during fuse replacement.

The action of the stabilizing surfaces is further enhanced by a three-point triangular leg structure by which the clip is soldered to the circuit board. As a result, the clip of this invention can safely withstand 15–20 fuse replacements as opposed to the 1 or 2 safe replacements common with conventional clips.

BRIEF DESCRIPTION OF THE DRAWINGS

FIG. 1 is a perspective view of a typical automotive fuse used in conjunction with the fuse clip of this invention;

FIG. 3 is a perspective view of a portion of a multi-level circuit board assembly using the inventive clip;

FIG. 4 is a vertical section of the assembly of FIG. 3 along line 4—4 of FIG. 3.

DESCRIPTION OF THE PREFERRED EMBODIMENT

Figure 2A:
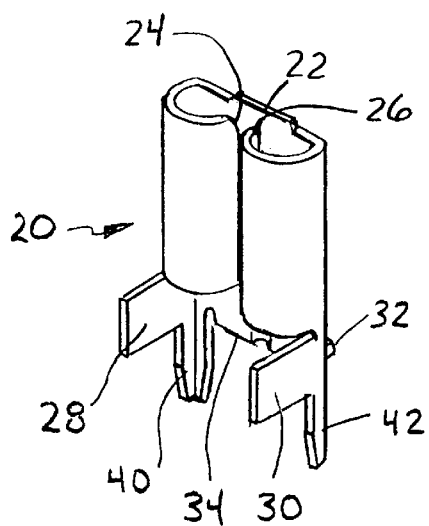
FIG. 2A is a perspective view of the inventive clip from the front.
Figure 2B:
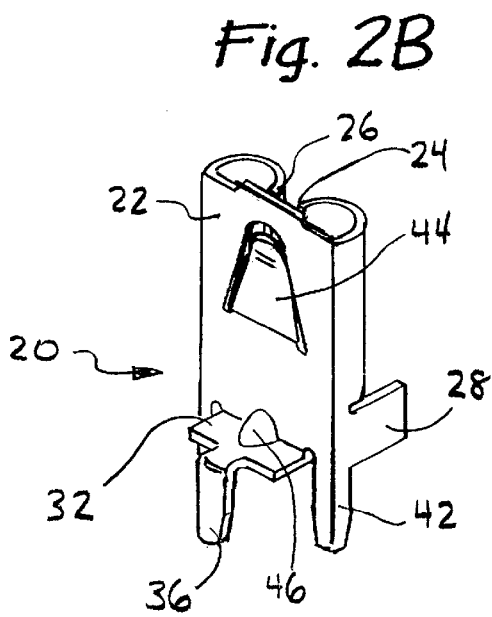
FIG. 2B is a perspective view of the inventive clip from the rear.
Figure 2C:
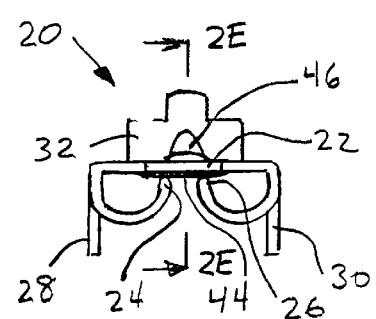
FIG. 2C is a top plan view of the inventive clip.
Figure 2D:
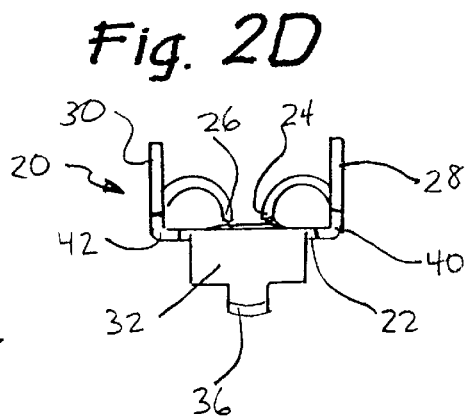
FIG. 2D is a bottom plan view of the inventive clip.
Figure 2E:
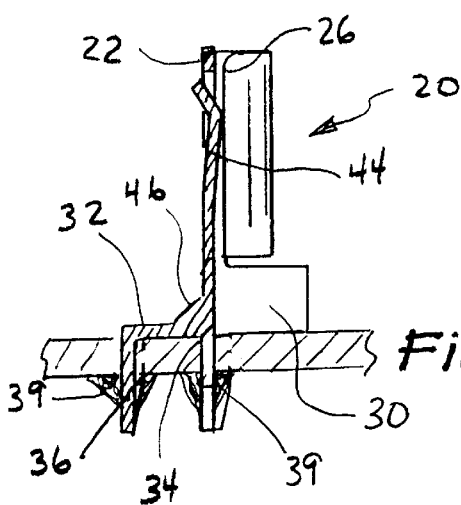
FIG. 2E is a section along line 2E—2E of FIG. 2C.

The present invention is concerned with the mounting of conventional automobile fuses such as shown in FIG. 1 on a multi-level printed circuit board assembly. The fuse 10 of FIG. 1 has a preferably transparent body 12 which contains the fusible element 14 that electrically connects the contact tabs 16, 18. The tabs 16, 18 are designed to be inserted into female clips 20 (FIGS. 2A–E) described in more detail below. The clips 20 are fixedly mounted (e.g. by soldering) on printed circuit boards and are electrically connected to appropriate circuit elements.

FIGS. 2a–e show in detail the fuse clip 20 of this invention. The clip 20 has a back plate 22 whose lateral ends 24, 26 are curled back toward the plate 22. The plate 22 and the curled ends 24, 26 together form a receptacle into which the tabs 16, 18 of the fuse 10 can be slid, and in which they are resiliently held. In accordance with the invention, vertical flanges 28, 30 extend perpendicularly to the plate 22 in a forward direction. A horizontal flange 32 extends rearwardly from the bottom edge 34 of the plate 22 and carries at its distal end a leg 36 adapted to protrude through the circuit board 38 and to be soldered thereto at 39 from the underside of the board 38. Additional legs 40, 42 are formed to depend from the lateral ends of the bottom edge 34 of the plate 22.

A portion of the back plate 22 is bent forwardly to form a spring 44 that presses an inserted fuse tab 16 or 18 firmly into contact with the curled ends 24, 26. A strengthening rib 46 prevents the horizontal flange 32 from being bent out of its horizontal position.

The underside of the horizontal flange 32, the bottom edge 34 of the plate 22, and the bottom edges of the vertical flanges 28, 30 are coplanar. In use, these elements lie flatly against the surface of the circuit board 38 and support the fuse clip 20 firmly in an upright position even before its soldered attachment to the board 38. Once soldered to the board 38, the inventive fuse clip is highly resistant to bending out of its vertical plane when a user "wiggles" a spent fuse 10 in an attempt to pull it out of the clip 20. This is so because of the vertical orientation of the flanges 28, 30 and the strengthened horizontal orientation of the flange 32, plus the triangular disposition of the soldered legs 36, 40, 42.

In this configuration, a vertical pull on the clip 20 is effectively opposed by the positioning of the soldered legs 40, 42 at the edges of the plate 22. A vertical push is opposed by the coplanar position of the flange 32 and the bottom edges of the plate 22 and the flanges 28, 30. Any forward bend of the plate 22 is prevented both by the contact of the bottom edges of flanges 28, 30 with the circuit board 38 and by the resistance of the distal soldered leg 36 against any axial pull. Any rearward bend of the plate 22 is prevented by the legs 36, 40 and 42 and by the strengthening rib 46 that maintains the flange 32 perpendicular to the plate 22. Any sideways bending of the plate 22 is prevented by the soldered legs 40, 42 positioned at its lateral edges.

The high stability of the inventive clips makes it possible for the clips 20 to not only be able to withstand many more fuse changes than conventional clips, but also to be much longer than conventional clips. This in turn allows fuses to interconnect circuitry on different levels of a multi-level circuit board assembly as illustrated in FIG. 3. In that figure, a bus board 50 supplies power through individual fuses 10 to a series of module boards 52 disposed transversely to the bus board 50 and vertically spaced therefrom.

As shown in FIGS. 3 and 4, clips 20 are mounted on the bus board 50 either beside the module board 52, or protruding through openings 54 in the module board 52. The clip 20 extends to a level sufficiently high to allow at least partial insertion of the fuse tab 18 into its upper portion when the fuse tab 16 is fully inserted in a short, sturdy clip 56 mounted on the module board 52. The clip 56 may be a short version of the inventive clip 20, or it may be another appropriate type of clip as shown in FIGS. 3 and 4.

The circuit boards 38 used in conjunction with this invention are typically wave-soldered. In that manufacturing process, it is particularly advantageous that the clips 20, due to their described features, can easily be dropped into position on the board 38 in correct alignment and remain in that alignment when contacted by the solder wave. As described above, the secure maintenance of alignment is substantially enhanced, in the inventive clip, by the positioning of the third leg 36 at the distal end of the horizontal flange 32.

It will be understood that the fuse clip described herein is only exemplary of the invention, and that modifications or adaptations may be made thereto within the scope of the following claims without departing from the invention.

We claim:

1. A fuse clip for printed circuit boards, comprising:
   a) a substantially flat vertical plate having side edges and a bottom edge;
   b) a substantially vertical flange extending in a first direction substantially perpendicularly to said plate from each of said side edges, the bottom edges of said flanges being coplanar with said bottom edge of said vertical plate;
   c) a substantially horizontal flange extending from said plate in a second direction opposite to said first direction in the horizontal plane formed by said bottom edges of said plate and vertical flanges;
   d) a first leg extending downwardly from said horizontal plane at the distal end of said horizontal flange; and
   e) a second leg extending downwardly from said horizontal plane at each of said side edges of said plate.

2. The clip of claim 1, in which said second legs are bent from coplanarity with said plate to coplanarity with a corresponding vertical flange."

3. The clip of claim 1, further comprising:
   f) a curved flange extending from each of said side edges of said plate, said curved flanges being curled back toward a central portion of said plate to form a tab-receiving socket therewith.

4. The clip of claim 3, in which a portion of said plate is resiliently bent toward said curved flanges to form therewith a contact adapted to resiliently engage a fuse tab inserted into said clip.

5. A fuse clip for printed circuit boards, comprising:
   a) a substantially flat vertical plate having side edges and a bottom edge;
   b) a substantially vertical flange extending in a first direction substantially perpendicularly to said plate from each of said side edges, the bottom edges of said flanges being coplanar with said bottom edge of said vertical plate;
   c) a substantially horizontal flange extending from said plate in a second direction opposite to said first direction in the horizontal plane formed by said bottom edges of said plate and vertical flanges;
   d) a first leg extending downwardly from said horizontal plane at the distal end of said horizontal flange;
   e) a second leg extending downwardly from said horizontal plane at each of said side edges of said plate; and
   f) said plate and said horizontal flange being deformed at at least a portion of their junction to form a strengthening rib impeding the bending of said horizontal flange in relation to said plate.

6. In combination with a printed circuit board assembly including a pair of spaced substantially parallel circuit boards, a fuse clip mounted on a first of said boards and extending above the other of said boards, and comprising:
   a) a substantially flat vertical plate having side edges and a bottom edge;
   b) a substantially vertical flange extending in a first direction substantially perpendicularly to said plate from each of said side edges, the bottom edges of said flanges being coplanar with said bottom edge of said vertical plate;
   c) a substantially horizontal flange extending from said plate in a second direction opposite to said first direction in the horizontal plane formed by said bottom edges of said plate and vertical flanges, said horizontal plane being coplanar with the surface of said first of said boards;
   d) a first leg extending downwardly from said horizontal plane at the distal end of said horizontal flange and being soldered to said first of said boards; and
   e) a second leg extending downwardly from said horizontal plane at each of said side edges of said plate and being soldered to said first of said boards;
   f) the vertical extent of said plate being sufficient for said clip to protrude above said other of said boards a sufficient distance to receive a fuse tab above the level of said other of said boards.

7. The combination of claim 6, further comprising:
   g) a second fuse clip substantially identical to said first-mentioned fuse clip mounted on said other of said boards and extending in the same direction as said first-mentioned clip;
   h) the length of said clips being sufficient to allow a fuse to have a first tab fully inserted in said second fuse clip and a second tab partially inserted in said first-mentioned clip.

* * * * *